US009576922B2

(12) United States Patent
Brunschwiler et al.

(10) Patent No.: US 9,576,922 B2
(45) Date of Patent: Feb. 21, 2017

(54) SILVER ALLOYING POST-CHIP JOIN

(71) Applicant: GLOBALFOUNDRIES INC., Grand Cayman (KY)

(72) Inventors: Thomas J. Brunschwiler, Thalwil (CH); Eric D. Perfecto, Poughkeepsie, NY (US); Jonas Zuercher, Chur (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/702,984

(22) Filed: May 4, 2015

(65) Prior Publication Data
US 2016/0329289 A1    Nov. 10, 2016

(51) Int. Cl.
H01L 23/00    (2006.01)
B23K 1/00    (2006.01)
B23K 31/02    (2006.01)

(52) U.S. Cl.
CPC ............ *H01L 24/10* (2013.01); *B23K 1/0016* (2013.01); *B23K 31/02* (2013.01); *H01L 24/26* (2013.01); *H01L 2924/01322* (2013.01); *H01L 2924/07025* (2013.01)

(58) Field of Classification Search
CPC ...... H01L 21/56; H01L 25/0657; H01L 24/32; H01L 24/83; H01L 24/29; H01L 24/75; H01L 21/563; H01L 23/295; H01L 2224/16225; H01L 2225/06517; H01L 2225/06513; H01L 2225/06589; H01L 2924/10253

See application file for complete search history.

(56) References Cited

U.S. PATENT DOCUMENTS

| | | | |
|---|---|---|---|
| 6,013,572 A | 1/2000 | Hur et al. | |
| 6,596,621 B1 | 7/2003 | Copeland et al. | |
| 8,197,612 B2 | 6/2012 | Busby et al. | |
| 8,240,544 B2 | 8/2012 | Danzer | |
| 8,378,485 B2 | 2/2013 | Bachman et al. | |
| 2003/0102571 A1* | 6/2003 | Chiu ..................... | H01L 21/563 257/778 |

(Continued)

FOREIGN PATENT DOCUMENTS

WO    2012083100 A2    6/2012

OTHER PUBLICATIONS

Bukat, K, et al.; "Silver Nanoparticles Effect on the Wettability of Sn—Ag—Cu Solder Pastes and Solder Joints Microstructure on Copper"; Soldering and Surface Mount Technology; vol. 23, No. 3; p. 150-160; 2011.

(Continued)

*Primary Examiner* — Joshua King
*Assistant Examiner* — Mohammed R Alam
(74) *Attorney, Agent, or Firm* — Yuanmin Cai, Esq.

(57) ABSTRACT

A method of forming a stacked surface arrangement for semiconductor devices includes joining a first surface to a second surface with a solder bump, the solder bump including a substantially pure first metal; depositing nanoparticles of a second metal onto a surface of the solder bump; performing an annealing operation to form a film of the second metal on the surface of the solder bump; and performing a reflow or a second annealing operation to transform the solder bump from the substantially pure first metal to an alloy of the first metal and the second metal.

20 Claims, 5 Drawing Sheets

(56) References Cited

U.S. PATENT DOCUMENTS

| | | | |
|---|---|---|---|
| 2007/0278456 A1* | 12/2007 | Sakai | H05K 3/3484 |
| | | | 252/512 |
| 2009/0096100 A1* | 4/2009 | Kajiwara | H01L 23/49513 |
| | | | 257/741 |
| 2009/0152719 A1* | 6/2009 | Lee | H01L 21/4846 |
| | | | 257/738 |
| 2009/0301606 A1 | 12/2009 | Ueshima | |
| 2012/0018864 A1* | 1/2012 | Krishnan | H01L 23/49513 |
| | | | 257/676 |
| 2012/0152752 A1 | 6/2012 | Keigler et al. | |
| 2012/0261819 A1 | 10/2012 | Brunschwiler et al. | |
| 2013/0049204 A1 | 2/2013 | Oeschler et al. | |
| 2013/0161776 A1* | 6/2013 | Iizuka | H01L 31/0203 |
| | | | 257/433 |
| 2014/0264820 A1* | 9/2014 | Hu | H01L 23/3736 |
| | | | 257/713 |

OTHER PUBLICATIONS

He, Ate, et al.; "Low-Temperature Bonding of Copper Pillars for All-Copper Chip-to-Substrate Interconnections"; Electrochemical and Solid-State Letters; vol. 9, No. 12; p. C192-C195; 2006.

Koo, Hyo-Chol, et al.; "Electroless Copper Bonding with Local Suppression for Void-Free Chip-to-Package Connections"; Journal of the Electrocheical Society; vol. 159, No. 5; p. D319-D322; 2012.

Lu, Minhua, et al.; "Comparison of Electromigration Performance for Pb-Free Solders and Surface Finishes with Ni UBM"; Electronic Components and Technology Conference; p. 360-365; 2008.

Lu, Minhua, et al.; "The Effects of Ag, Cu Compositions and Zn Doping on the Electromigration Performance of Pb-Free Solders"; Electronic Components and Technology Conference; p. 922-929; 2009.

Sylvestre, Julien, et al.; "The Impact of Process Parameters on the Fracture of Device Structures During Chip Joining on Organic Laminates"; Electronic Components and Technology Conference; p. 82-88; 2008.

* cited by examiner

SILVER ALLOYING POST-CHIP JOIN

BACKGROUND

The present disclosure generally relates to stacked surface arrangements, and more particularly, to soldering between stacked surface arrangements.

Lead-free solder joining of large dies to an organic or ceramic substrate can result in high stresses on the chip internal wiring due to the high coefficient of thermal expansion (CTE) mismatch between the die and substrate. Low-k dielectrics can fracture due to these large stresses, which maximize during the cooling cycle of the joining process. One of the ways to determine dielectric failure after chip joining is through the use of acoustic micro imaging, where any fracture is reflected as a white area, or as it is commonly referred, a white bump (see FIGS. 1A and 1B). Formation of white bumps can indicate that stresses between a chip and a substrate are so high that fracture in the interlayer dielectric in the vicinity of the solder bump occurs.

There are several ways to reduce the CTE effect, for example differential heating and cooling during thermal compression bonding. However, this requires individual chip alignment and joining and is more costly than mass reflow.

SUMMARY

In one embodiment of the present disclosure, a method of forming a stacked surface arrangement for semiconductor devices includes joining a first surface to a second surface with a solder bump, the solder bump including a substantially pure first metal; depositing nanoparticles of a second metal onto a surface of the solder bump; performing an annealing operation to form a film of the second metal on the surface of the solder bump; and performing a reflow or a second annealing operation to transform the solder bump from the substantially pure first metal to an alloy of the first metal and the second metal.

In another embodiment, a method of forming a stacked surface arrangement for semiconductor devices includes joining a first surface to a second surface with solder bumps comprising a substantially pure first metal; injecting a nanosuspension including nanoparticles of a second metal onto a surface of the solder bumps; annealing the solder bumps between the first surface and the second surface to form a film of the second metal on the surface of the solder bumps; forming an underfill material to fill a gap between the first surface and second surface, the underfill material surrounding the solder bumps; and performing a reflow operation to transform the solder bumps from the substantially pure first metal to an alloy of the first metal and the second metal.

Yet, in another embodiment, a stacked surface arrangement includes a solder bump between a first surface and a second surface; wherein the solder bump includes a tin-silver alloy comprising at least 2 wt. % silver.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 3-7 are a series of cross-sectional side views illustrating a method of forming a stacked surface arrangement for semiconductor devices in accordance with an exemplary embodiment, in which:

FIG. 3 illustrates a cross-sectional side view of a stacked surface arrangement including a first surface joined to a second surface with solder bumps;

FIG. 4 is illustrates a cross-sectional side view of the stacked surface arrangement of FIG. 3 during deposition of metallic nanoparticles onto a surface of the solder bumps;

FIG. 5 illustrates a cross-sectional side view of the stacked surface arrangement of FIG. 4 after annealing to immobilize the metallic nanoparticles;

FIG. 6 illustrates a cross-sectional side view of the stacked surface arrangement of FIG. 5 after underfilling spaces between the solder bumps; and FIG. 7 illustrates a cross-sectional side view of the stacked surface arrangement of FIG. 6 after forming a metallic alloy on the solder bumps.

DETAILED DESCRIPTION

Disclosed herein are methods and stacked surface arrangements (or joints) resulting from joining two surfaces with solder bumps (or balls) followed by metallic nanoparticle suspension deposition onto a surface of the solder bumps to form a metallic alloy. The stacked surface arrangements are used for semiconductor devices.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the terms "percent by weight," "% by weight," and "wt. %" mean the weight of a pure substance divided by the total dry weight of a compound or composition, multiplied by 100.

Figure 1B:
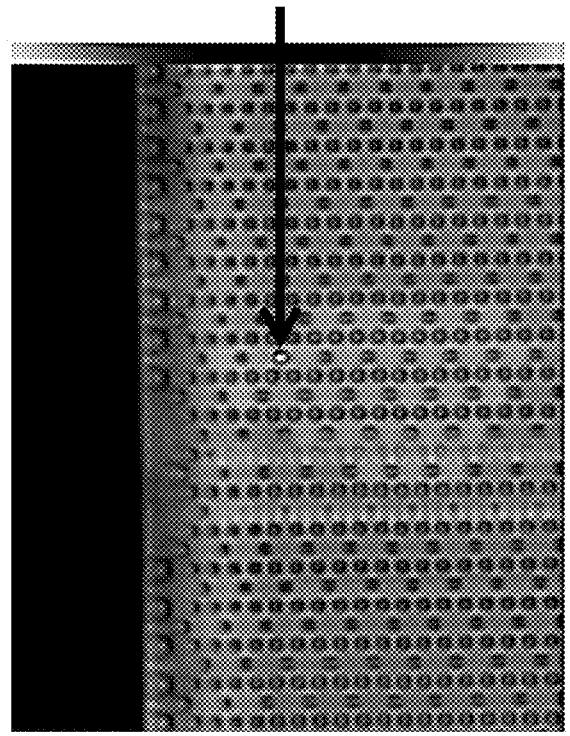
FIG. 1B illustrates a SEM image of a white bump detected by acoustic micro imaging.
Figure 1A:
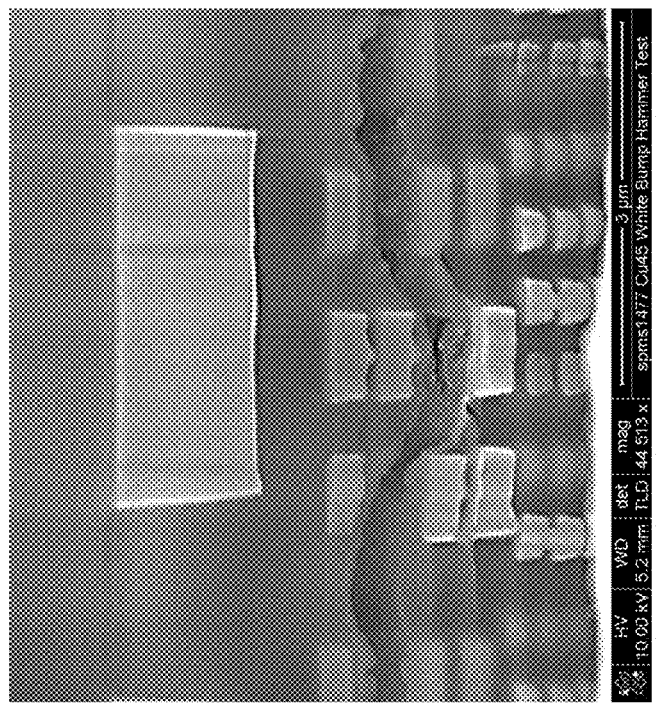
FIG. 1A illustrates a scanning electron microscope (SEM) image of a fracture in low-k dielectric layers.
Figure 2B:
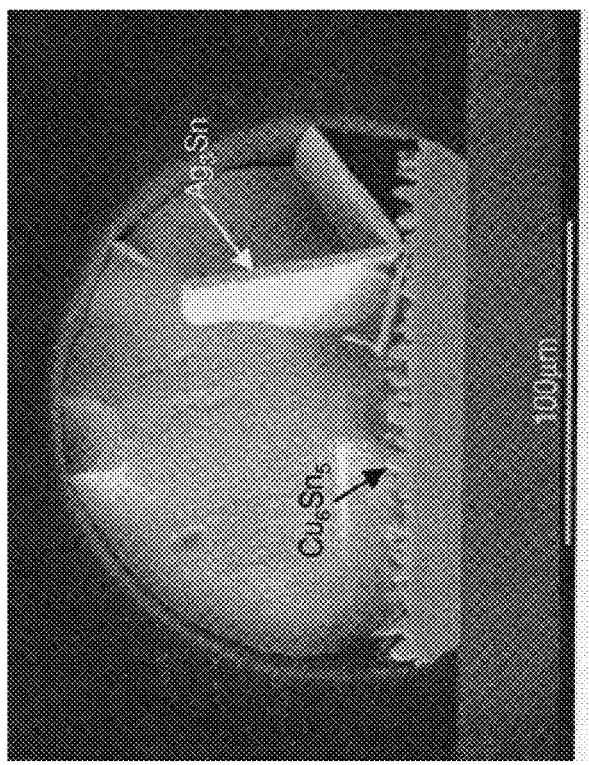
FIG. 2B illustrates a SEM image of a $Ag_3Sn$ platelet within a solder bump.
Figure 2A:
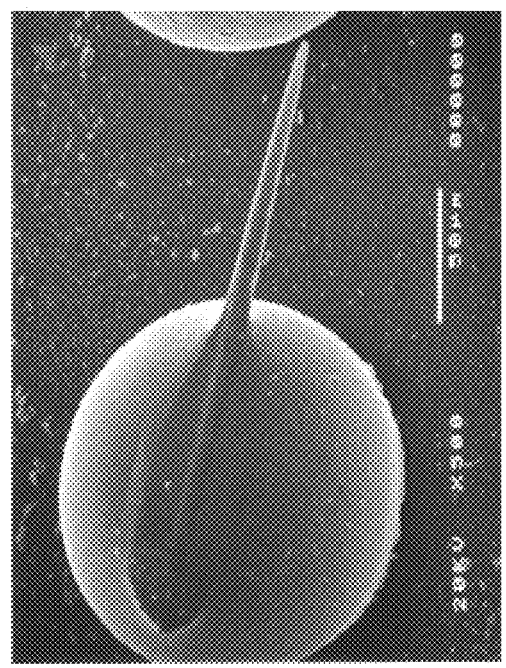
FIG. 2A illustrates a SEM image of a $Ag_3Sn$ platelet of a solder bump.

The present disclosure mitigates white bump risk without special joining processes and improves electromigration resistance of solder joints. Although adding silver to pure tin solder joints can significantly enhance electromigration resistance by increasing current density, larger silver amounts (generally more than about 2 wt. %) can result in $Ag_3Sn$ plates (see FIGS. 2A and 2B), which are solid during reflow. The solid plates can reduce or prevent solder wetting, resulting in open electrical contacts.

The present disclosure provides a sequential joint formation process. In some embodiments, the process includes performing reflow with pure or substantially pure tin (Sn) joints and then forming silver (Ag) alloys in the joints including more than 2 wt. % silver.

Advantages of the disclosed processes include improved robustness of pure Sn plating processes compared to SnAg processes, reduced white bump risk due to lower yield strength of Sn compared to SnAg at normal reflow conditions, and a larger variation of Ag content (more than 2%), which improves the electromigration resistance strength of the joints.

Figure 3:
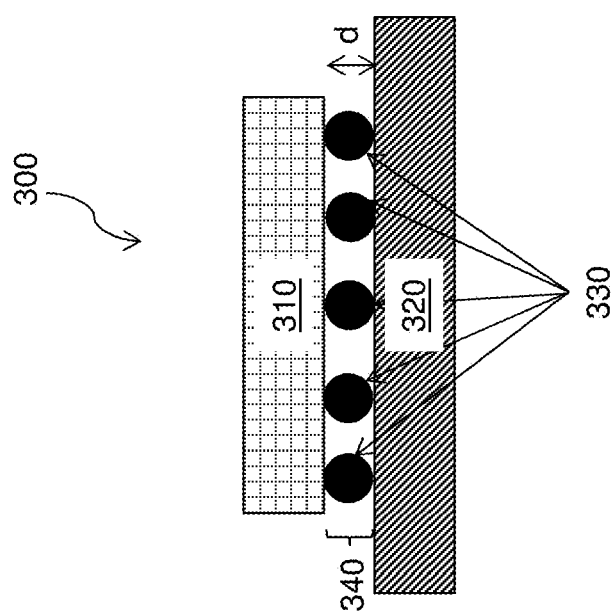

FIG. 3 illustrates a cross-sectional side view of a stacked surface arrangement 300 including a first surface 310 (e.g., a board, die, or chip) joined to a second surface 320 (e.g., an interposer, laminate or other substrate) with solder bumps 330. The solder bumps 330 are formed between the first surface 310 and the second surface 320 by a reflow process or operation. In reflow soldering (or reflow), a solder paste is electroplated on the first surface 310 and deposited by stencil printing on the second surface 320. Controlled heat is applied to melt the solder, which permanently connects the joint. For example, the assembly can be passed through a reflow oven or under an infrared lamp. In another example, the individual joints are soldered with a hot air pencil.

The solder bumps 330 define the distance d between the first surface 310 and the second surface 320. The solder bumps 330 secure the first surface 320 to the second surface 320. The solder bumps 330 are arranged in a gap 340 between the first surface 310 and the second surface 320.

The distance d is not intended to be limited. In one embodiment, the distance d is in a range from about 10 to about 100 microns. In another embodiment, the distance d is in a range from about 10 microns to about 1000 microns. Yet, in another embodiment, the distance d is in a range from about 10 microns to about 500 microns.

As indicated above, the second surface 320 is an organic substrate or laminate. More specifically, the second surface 320 can be a printed circuit board comprising ceramic, silicon, glass, polymers, copper, or any combination thereof.

The first surface 310 is a board, die, or chip. The first surface 310 may include, for example, silicon.

The solder bumps 330 include a first metal. In one embodiment, the solder bumps include pure tin. In another embodiment, the solder bumps 330 include substantially pure tin.

Figure 4:
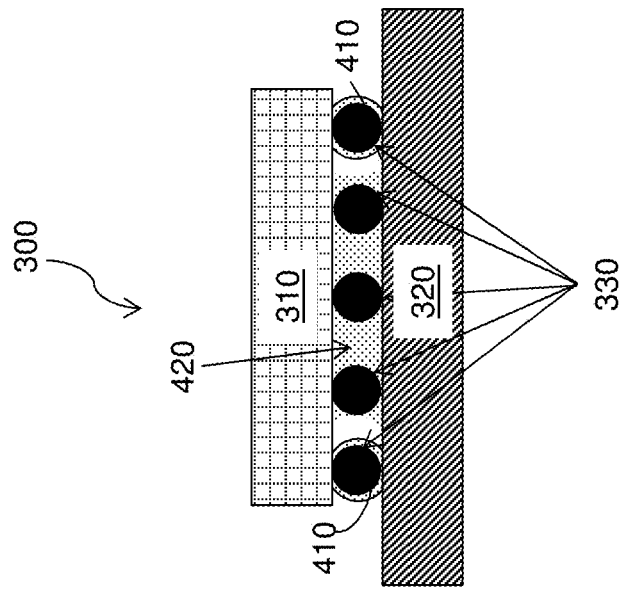

FIG. 4 illustrates a cross-sectional side view of the stacked surface arrangement 300 after during deposition of silver metallic nanoparticles onto a surface 410 of the solder bumps 330 of FIG. 3. A nanosuspension 420 is injected between the first surface 320 and the second surface 310. The nanosuspension 420 includes nanoparticles including of a second metal in a suitable solvent. The solvent is evaporated from the nanosuspension 420 after injection. Non-limiting examples of suitable solvents include triethylene glycol monomethyl ether (TGME), xylene, water, isopropanol, ethanol, or any combination thereof. The nanosuspension 420 may further include components for surface functionalization to prevent agglomeration and oxidation of the nanoparticles.

The nanosuspension 420 includes nanoparticles in an amount in a range from about 0.5 to about 3 vol. %. In one embodiment, the nanosuspension 420 includes nanoparticles in an amount in a range from about 0.1 to about 10 vol. %.

The nanoparticles are metallic nanoparticles of a second metal. The second metal can be silver or a silver alloy. In one embodiment, the nanoparticles are silver nanoparticles.

The nanoparticles have a diameter that is not intended to be limited. In some embodiments, the nanoparticles have a diameter in a range from about 10 nm to about 300 nm.

In some embodiments, the metallic nanoparticles in the nanosuspension 420 can include any metal or metallic alloy. For example, the nanosuspension 420 can include gold, copper, silver, or any combination thereof.

A metallic oxide (not shown) forms on a surface of the solder bumps 330. Then the nanoparticles selectively assemble on the surface 410 of the solder bumps 330. For example, when the solder bumps 330 include tin, tin oxide forms on the surface 410 of the solder bumps 330.

Without being bound by theory, selective assembly on the surface 410 of the solder bumps 330 occurs due to the lower contact angle between the nanosuspension 420 and the metallic oxide on the surface of the solder bumps 330 compared to the contact angle between the nanosuspension 420 and the first surface 320 or the second surface 310.

The first surface 310 can include a hydrophobic polymeric layer, for example, a polyimide layer. The second surface 320 can include, for example, a hydrophobic polymeric layer, for example, an epoxy layer or an acrylic layer. The contact angle of the nanosuspension 420 is larger on the polymeric (hydrophobic surface), and hence, the dispersant easily retracts during solvent evaporation and does not leave nanoparticle deposits on the first or second surfaces 310, 320. However, the low contact angle between the nanosuspension 420 and the solder bumps results in nanoparticle deposits on the surface 410 of the solder bumps 330 during solvent evaporation. Thus, selective assembly on the surface 410 of the solder bumps 330 occurs.

The first surface 310 thus can include a polyimide that provides a hydrophobic surface between the solder bumps 330. The second surface 320 can include an acrylic that provides a hydrophobic surface between the solder bumps.

Optionally, passivation of the first surface 310 forms a polyimide layer on the first surface 310. The polyimide layer can protect the first surface 310 and locally support the solder bumps to prevent stress concentrations. The contact angle between the polyimide layer on the first surface 310 is greater than the contact angle between the nanosuspension 420 on the surface 410 of the solder bumps 330, which results in selective assembly.

Optionally, a solder stop process performed on the second surface 320 forms a layer of acrylic or epoxy on the second surface 320. An acrylic or epoxy layer is used on laminates as a solder mask to constrain the solder wetting to pad locations. The contact angle between the resulting acrylic or epoxy layer on the second surface 320 is greater than the contact angle between the nanosuspension 420 on the surface 410 of the solder bumps 330, which results in selective assembly.

Thin deposits of the metallic nanoparticles can form between the solder bumps. To improve selective assembly on the surface 410 of the solder bumps 330, reduce deposition between the solder bumps 330, and reduce shorting risks, optional processing is performed. In one exemplary embodiment, mild wet etching is used to remove thin metallic nanoparticle deposits from gaps between the solder bumps 330.

In another exemplary embodiment, the thin deposits between the solder bumps 330 are substantially fully oxidized, and the metallic nanoparticles on the surface 410 of the solder bumps 330 are partially oxidized. Oxidation is performed, for example, by plasma or thermal oxidation.

Optionally, the wetting contrast between the nanosuspension 420 and the solder bumps 330 compared to the first surface 310 or second surface 320 can be increased to improve selective assembly. For example, the first and second surfaces 310, 320 materials can be selected to have reduced wettability. In another example, the nanosuspension 420 solvent can be selected to increase wetting contrast. Optionally, the solder bumps 330 are selectively oxidized before depositing the metallic nanoparticles in the nanosuspension 420 to lower the surface free energy.

In one embodiment, the first or second surfaces 310, 320 are chemically treated to form a surface monolayer (not shown). Optionally, an oxide plasma process can subsequently remove the surface monolayer, for example, before underfilling (described below) to prevent reduced adhesion.

In another embodiment, a lift-off process is used to improve selective assembly. A thin sacrificial layer (not shown) is formed on the first or second surfaces 310, 320 before depositing the solder bumps 330. The sacrificial layer is removed by etching after depositing the metallic nanoparticles on the surface 410.

Figure 5:
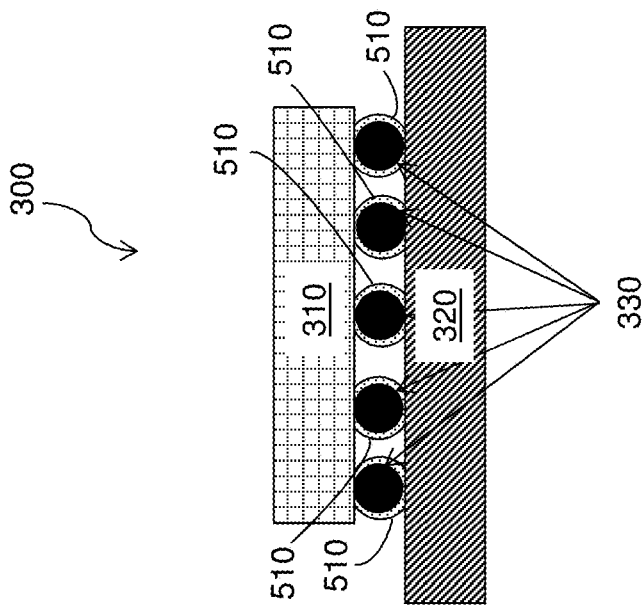

FIG. 5 illustrates a cross-sectional side view of the stacked surface arrangement 300 after annealing the solder bumps 330 of FIG. 4. The annealing procedure or operation is performed at a temperature to provide a desired mechanical strength of the metal layer 510. Annealing substantially removes organic materials (e.g., solvent, surfactant, and any functionalization on the nanoparticles) and forms a film 510 on the surface 410 of the solder bumps 330 that can withstand further processing steps. Metallic bonds form between the nanoparticles, as well as between the nanoparticles and the surface 410 of the solder bumps. The film 510 includes the second metal of the nanoparticles.

The thickness of the film 510 is not intended to be limited. In one embodiment, the film 510 has a thickness in a range of from about 100 nm to about 1000 nm. In another embodiment, the film 510 has a thickness in a range from about 200 nm to about 600 nm. Yet, in another embodiment, the film 510 has a thickness in a range from about 300 to about 500 nm.

In an exemplary embodiment, a 381 nm thick Ag film is required to yield a 2 wt. % Ag alloy in Sn joints with a diameter of 110 μm. This can be achieved by a nanosuspension with a 0.53 vol. % Ag content for an interconnect pitch of 186 μm.

Annealing temperature is not intended to be limited. In one exemplary embodiment, the annealing temperature is at least 100° Celsius (° C.). In other embodiments, the annealing temperature is in a range from about 100 to about 200 C. However, the maximum temperature may be defined by the reflow temperature, and the minimum temperature may be defined by the evaporation of organics from the nanosuspension.

Annealing may be performed at the above temperatures for any desired time, which may be, for example, about 1 minute (min) to about 30 min. The annealing may occur under ambient conditions, vacuum conditions, reducing conditions (e.g., in the presence of forming gas or formic acid), or atmospheric conditions.

Figure 6:
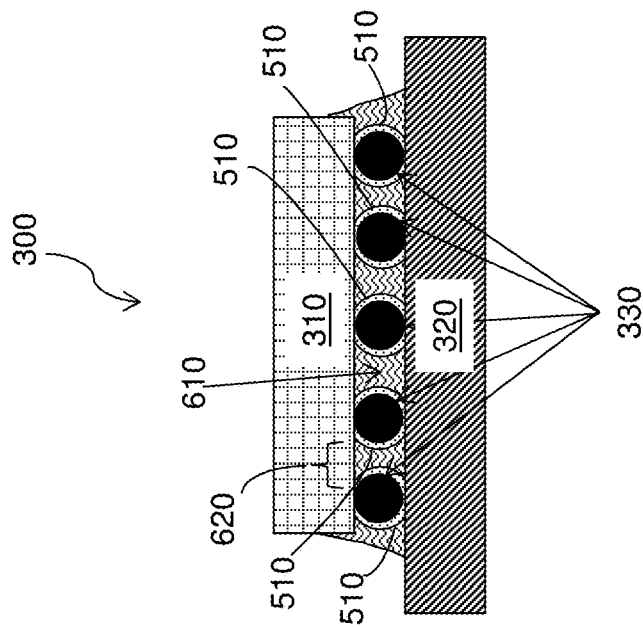

FIG. 6 illustrates a cross-sectional side view of the stacked surface arrangement 300 after forming an underfill material 610 in the gaps 620 between the solder bumps 330 of FIG. 5. With a suitable underfill material 610, capillary action fills the gaps and enhances the integrity of the film 510. Forming the underfill material 610 in the gaps 620 is performed after annealing in some embodiments. The underfill material 610 surrounds the solder bumps 330.

Non-limiting examples of suitable underfill materials 610 include silica particle loaded epoxies applied by capillary action. A thermally conducting underfill material 610 can be used.

Underfilling is performed from the chip edge. The underfill material 610 is cured to form a substantially solid surface that is substantially free of air or gas voids.

Figure 7:
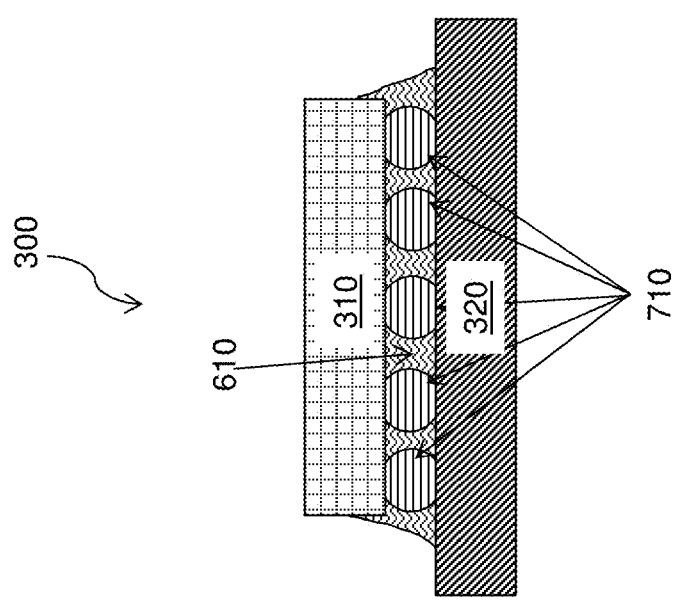

FIG. 7 illustrates a cross-sectional side view of the stacked surface arrangement 300 after converting the solder bumps 330 of FIG. 6 to solder bumps of a metallic alloy 710. A reflow process or operation is performed after forming the underfill material 610 in the gaps 620. The reflow operation transforms the solder bumps 330 from the substantially pure first metal to an alloy of the first metal and the second metal. In another embodiment, a long (e.g., more than 30 minutes) or high temperature (e.g., about 200° C.) annealing process may be performed to form the metallic alloy 710.

In one exemplary embodiment, a reflow process or operation, such as ball grid array (BGA) reflow process or operation, is used to convert pure or substantially pure tin solder bumps to the metallic alloy 710.

The metallic alloy 710 can form a layer on a surface of the solder bumps. The metallic alloy 710 can form a portion or substantially all of the solder bumps. In one embodiment, substantially the entire solder bump includes the metallic alloy.

In one embodiment, the solder bumps 330 include Sn, the nanoparticles include Ag, and the resulting metallic alloy 710 is a Sn—Ag alloy. The Sn—Ag alloy includes at least 2 wt. % silver. In some embodiments, the metallic alloy 710 includes at least 4, at least 6, at least 8, at least 9, or at least 10 wt. % silver.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a stacked surface arrangement for semiconductor devices, the method comprising:
   joining a first surface to a second surface with a solder bump, the solder bump comprising a substantially pure first metal;
   after the joining, depositing a film of a second metal onto an exposed surface of the solder bump by injecting a nanosuspension comprising nanoparticles of the second metal between the first surface and the second surface around the exposed surface of the solder bump and performing an annealing operation; and
   performing a reflow operation or a second annealing operation to transform the solder bump from the substantially pure first metal to an alloy of the first metal and the second metal.

2. The method of claim 1, the first surface and the second surface comprising hydrophobic polymeric layers that cause the nanosuspension to retract during the anneal operation, ensuring that the film of the second metal only deposits onto the exposed surface of the solder bump and not the first surface and the second surface.

3. The method of claim 1, the annealing operation causing a solvent from the nanosuspension to evaporate and the nanoparticles to deposit onto the exposed surface of the solder bump by capillary action.

4. The method of claim 1, wherein the first metal is tin (Sn).

5. The method of claim 1, wherein the second metal is silver (Ag).

6. The method of claim 1, further comprising forming an underfill material around the solder bump after the performing of the annealing operation and before the performing of the reflow operation.

7. The method of claim 1, wherein the alloy is an SnAg alloy and includes at least 2 wt. % silver.

8. A method of forming a stacked surface arrangement for semiconductor devices, the method comprising:
   joining a first surface to a second surface with solder bumps comprising a substantially pure first metal;
   after the joining, depositing a film of a second metal onto exposed surfaces of the solder bumps by injecting a nanosuspension comprising nanoparticles of the second metal between the first surface and the second surface around the exposed surfaces of the solder bumps and performing an annealing operation;
   forming an underfill material around the solder bumps to fill gaps between the solder bumps; and
   after the forming of the underfill material around the solder bumps, performing a reflow operation to transform the solder bumps from the substantially pure first metal to an alloy of the first metal and the second metal.

9. The method of claim 8, the annealing operation causing a solvent from the nanosuspension to evaporate and the nanoparticles to deposit onto the exposed surfaces of the solder bump by capillary action.

10. The method of claim 8, wherein the nanoparticles selectively assemble on the exposed surfaces of the solder bumps.

11. The method of claim 10, wherein tin oxide is present on the exposed surfaces of the solder bumps and then the nanoparticles selectively assembly on the exposed surfaces.

12. The method of claim 8, wherein the film has a thickness in a range from about 100 nm to about 1000 nanometers (nm).

13. The method of claim 8, wherein the second metal is silver.

14. The method of claim 8, wherein the substantially pure first metal is tin.

15. The method of claim 8, wherein the annealing operation is performed at a temperature of at least 100° Celsius (° C.).

16. The method of claim 8, further comprising wet etching to remove nanoparticles from gaps between the solder bumps.

17. The method of claim 8, the first surface and the second surface comprising hydrophobic polymeric layers that cause the nanosuspension to retract during the anneal operation, ensuring that the film of the second metal only deposits onto the exposed surface of the solder bump and not the first surface and the second surface.

18. A method of forming a stacked surface arrangement for semiconductor devices, the method comprising:
   joining a first surface to a second surface with a solder bump, the solder bump comprising a substantially pure first metal;
   after the joining, selectively depositing a film of a second metal onto an exposed surface of the solder bump such that, following the depositing of the film, the first surface and the second surface remain free of the film, the selectively depositing comprising:
      injecting a nanosuspension comprising nanoparticles of the second metal between the first surface and the second surface around the exposed surface of the solder bump; and
      performing an annealing operation; and
   performing a reflow operation to transform the solder bump from the substantially pure first metal to an alloy of the first metal and the second metal.

19. The method of claim 18,
   the first metal comprising tin (Sn),
   the second metal comprising silver (Ag), and
   the first surface and the second surface comprising hydrophobic polymeric layers that cause the nanosuspension to retract during the anneal operation, ensuring that the film of the second metal only deposits onto the exposed surface of the solder bump and not the first surface and the second surface.

20. The method of claim 18, the annealing operation causing a solvent from the nanosuspension to evaporate and the nanoparticles to deposit onto the exposed surface of the solder bump by capillary action.

* * * * *